(12) United States Patent
Sakano et al.

(10) Patent No.: US 7,341,644 B2
(45) Date of Patent: Mar. 11, 2008

(54) METHOD FOR PREDICTING CONSUMPTION OF CONSUMABLE PART, METHOD FOR PREDICTING DEPOSITED-FILM THICKNESS, AND PLASMA PROCESSOR

(75) Inventors: Shinji Sakano, Nirasaki (JP); Tsuyoshi Sendoda, Oume (JP)

(73) Assignee: Tokyo Electron Limited, Tokyo-To (JP)

( * ) Notice: Subject to any disclaimer, the term of this patent is extended or adjusted under 35 U.S.C. 154(b) by 782 days.

(21) Appl. No.: 10/312,909

(22) PCT Filed: Jul. 3, 2001

(86) PCT No.: PCT/JP01/05755

§ 371 (c)(1),
(2), (4) Date: Jun. 11, 2003

(87) PCT Pub. No.: WO02/03440

PCT Pub. Date: Jan. 10, 2002

(65) Prior Publication Data

US 2004/0007560 A1   Jan. 15, 2004

(51) Int. Cl.
*H01L 21/00* (2006.01)
*C23C 16/00* (2006.01)
*C23C 14/00* (2006.01)

(52) U.S. Cl. .......................... 156/345.24; 156/345.25; 156/345.26; 118/712; 204/192.1; 204/298.01

(58) Field of Classification Search ........... 156/345.24, 156/345.25, 345.28; 118/715; 204/298.01, 204/192.1

See application file for complete search history.

(56) References Cited

U.S. PATENT DOCUMENTS 5,458,732 A * 10/1995 Butler et al. ................... 216/61

(Continued)

FOREIGN PATENT DOCUMENTS

JP         09-216066         8/1997

(Continued)

OTHER PUBLICATIONS

Wise, B. M., et al., "Development and Benchmarking of Multivariate Statistical Process Control Tools for a Semiconductor Etch Process: Impact of Measurement Selection and Data Treatment on Sensitivity", Proc. IFAC Symp. On Fault detection, Supervision and Safety for Technical Process, (1997), vol. 1, pp. 35 to 42, especially, pp. 36 to 39.

(Continued)

*Primary Examiner*—Ram N. Kackar
(74) *Attorney, Agent, or Firm*—Smith, Gambrell & Russell, LLP

(57) ABSTRACT

There is not known a conventional method for predicting the consumed degree of consumable supplies and the thickness of deposited films without opening a processing chamber.

A method for predicting the consumed degree of a consumable supply and the thickness of a deposited film according to the present invention is used for a plasma processing system 10 for carrying out a predetermined processing for a wafer W with plasma which is produced from a process gas by applying a high-frequency power, and comprises the steps of: measuring the voltages and currents of a fundamental wave and its integer-times waves of a high-frequency power supply 20, which vary in accordance with the thickness of a focus ring 21 and the thickness of a deposited film, with elapsed time; and using these measured data to carry out a multiple regression analysis to predict the thickness of the focus ring 21 and the thickness of the deposited film.

2 Claims, 3 Drawing Sheets

U.S. PATENT DOCUMENTS 5,576,629 A * 11/1996 Turner et al. ............... 324/709
5,810,963 A    9/1998 Tomioka .................... 156/345
6,197,116 B1 * 3/2001 Kosugi ...................... 118/712

FOREIGN PATENT DOCUMENTS

JP      10-74734     3/1998
JP      10-218664    8/1998

OTHER PUBLICATIONS

PCT Notification of Transmittal of Copies of Translation of the International Preliminary Examination Report (PCT/IB/338) issued for PCT/JP01/05755.

International Preliminary Examination Report (PCT/IPEA/409) (translated) issued for PCT/JP01/05755.

* cited by examiner though there are any methods for measuring the thickness of

METHOD FOR PREDICTING CONSUMPTION OF CONSUMABLE PART, METHOD FOR PREDICTING DEPOSITED-FILM THICKNESS, AND PLASMA PROCESSOR

TECHNICAL FIELD

The present invention relates generally to a method for predicting the consumed degree of consumable supplies, a method for predicting the thickness of deposited films. More specifically, the invention relates to a method for predicting the consumed degree of consumable supplies for use in a plasma processing system, a method for predicting the thickness of deposited films formed by a process gas in the plasma processing system, and the plasma processing system.

BACKGROUND ART

Atypical plasma processing system is used for etching, deposition and so forth. A plasma processing system of this type comprises, e.g., top and bottom electrodes provided in parallel to each other in a processing chamber, and is designed to apply a high-frequency power to the bottom electrode and feed a process gas into the processing chamber to produce the plasma of the process gas by discharge between the top and bottom electrodes to carry out a predetermined plasma processing for a processing object, such as a semiconductor wafer. However, by-products are produced from the process gas during the plasma processing, and these by-products are deposited on the wall surfaces and the top and bottom electrodes in the system to form deposited films. Since the deposited films cause particles if leaving them as they are, the interior of the system is cleaned at the right time to remove the deposited films. In addition, consumable supplies, such as a focus ring, are used in the plasma processing system. These consumable supplies are under attack from the plasma to be consumed. For that reason, the consumable supplies are exchanged during maintenance, such as cleaning.

However, any methods for measuring the thickness of deposited films without opening the processing chamber of a plasma processing system are not known. Therefore, timing in removing the deposited films, i.e., cleaning timing, must be determined by trusting operator's experience and intuition. In addition, the kind of the deposited films varies in accordance with the kind of the process gas, and the growth rates of the respective deposited films are different, so that it is next to impossible to appropriately predict a cleaning period.

Moreover, the consumed degrees of consumable supplies vary in accordance with the processing contents similar to the growth rates of the deposited films, and any methods for predicting the consumed degree of consumable supplies without opening the processing chamber are not known, so that the consumable supplies must be exchanged during maintenance.

DISCLOSURE OF THE INVENTION

It is therefore an object of the present invention to eliminate the aforementioned problems and to provide a method for predicting the consumed degree of a consumable supply, which is capable of predicting an exchange period of a consumable supply without opening a processing system, and a method for predicting the thickness of a deposited film, which is capable of predicting the thickness of a deposited film without opening a processing system.

According to a first aspect of the present invention, there is provided a method for predicting the consumed degree of a consumable supply for use in a processing system for carrying out a predetermined processing for a processing object with plasma which is produced from a process gas by applying a high-frequency power, the method comprising the steps of: measuring a plurality of electric data, which vary in accordance with the consumed degree of a consumable supply, with elapsed time; and using the measured electric data to carry out a multivariate analysis to predict the consumed degree.

The step of carrying out the multivariate analysis to predict the consumed degree may be a step of carrying out a multiple regression analysis to predict the consumed degree.

The voltages and currents of a fundamental wave and waves having frequencies integer times as many as that of the fundamental wave between a matching circuit in a high-frequency power supply line and a processing chamber may be used as the electric data.

The voltages and currents of four kinds of high-frequency waves including the fundamental wave and its double, triple and quadruple waves may be used as the electric data.

The consumed degree may be based on the thickness of the consumable supply.

The consumable supply may be a focus ring.

According to a second aspect of the present invention, there is provided a method for predicting the thickness of a deposited film formed in a processing system for carrying out a predetermined processing for a processing object with plasma which is produced from a process gas by applying a high-frequency power, the method comprising the steps of: measuring a plurality of electric data, which vary in accordance with the thickness of a deposited film, with elapsed time; and using the measured electric data to carry out a multivariate analysis to predict the thickness of the deposited film.

The step of carrying out the multivariate analysis to predict the thickness of the deposited film may be a step of carrying out a multiple regression analysis to predict the thickness of the deposited film.

The voltages and current of a fundamental wave and waves having frequencies integer times as many as that of the fundamental wave between a matching circuit in a high-frequency power supply line and a processing chamber may be used as the electric data.

The voltages and currents of four kinds of high-frequency waves including the fundamental wave and its double, triple and quadruple waves may be used as the electric data.

A plasma processing system according to the present invention is a plasma processing system for carrying out a predetermined processing for a processing object with plasma which is produced from a process gas by applying a high-frequency power, the plasma processing system comprising: measuring means for measuring a plurality of electric data, which vary in accordance with the consumed degree of a consumable supply, with elapsed time; and predicting means for using the electric data measured by the measuring means, to carry out a multivariate analysis to predict the consumed degree.

The predicting means for carrying out the multivariate analysis to predict the consumed degree may carry out a multiple regression analysis to predict the consumed degree.

The measuring means may measure the voltages and current of a fundamental wave and waves having frequencies integer times as many as that of the fundamental wave between a matching circuit in a high-frequency power supply line and a processing chamber, as the electric data.

The voltages and currents of four kinds of high-frequency waves including the fundamental wave and its double, triple and quadruple waves may be used as the electric data.

The consumed degree may be based on the thickness of the consumable supply.

The consumable supply may be a focus ring.

A plasma processing system according to the present invention may be a plasma processing system for carrying out a predetermined processing for a processing object with plasma which is produced from a process gas by applying a high-frequency power, the plasma processing system comprising: measuring means for measuring a plurality of electric data, which vary in accordance with the thickness of a deposited film formed in the processing system, with elapsed time; and predicting means for using the electric data measured by the measuring means, to carry out a multivariate analysis to predict the thickness of the deposited film.

According to the present invention, it is possible to easily and surely a plurality of measured data necessary for a multivariate analysis, by paying attention to the voltages and currents of a fundamental wave and its integer-times waves between a matching circuit in a high-frequency power supply line and a processing chamber, as electric data. It is also possible to collect reliable measured data without being influenced by random fluctuation, by measuring a plurality of electric data varying in accordance with the consumed degree of consumable supplies, with elapsed time.

According to the present invention, it is possible to provide a method for predicting the consumed degree of a consumable supply and a plasma processing system, which are capable of predicting an exchange period of a consumable supply without opening the processing system to predict the life of the consumable supply to appropriately determine its exchange period.

According to the present invention, it is possible to provide a method for predicting the thickness of a deposited film and a plasma processing system, which are capable of predicting the thickness of a deposited film without opening the processing system to appropriately determine a cleaning period.

BEST MODE FOR CARRYING OUT THE INVENTION

Figure 1:
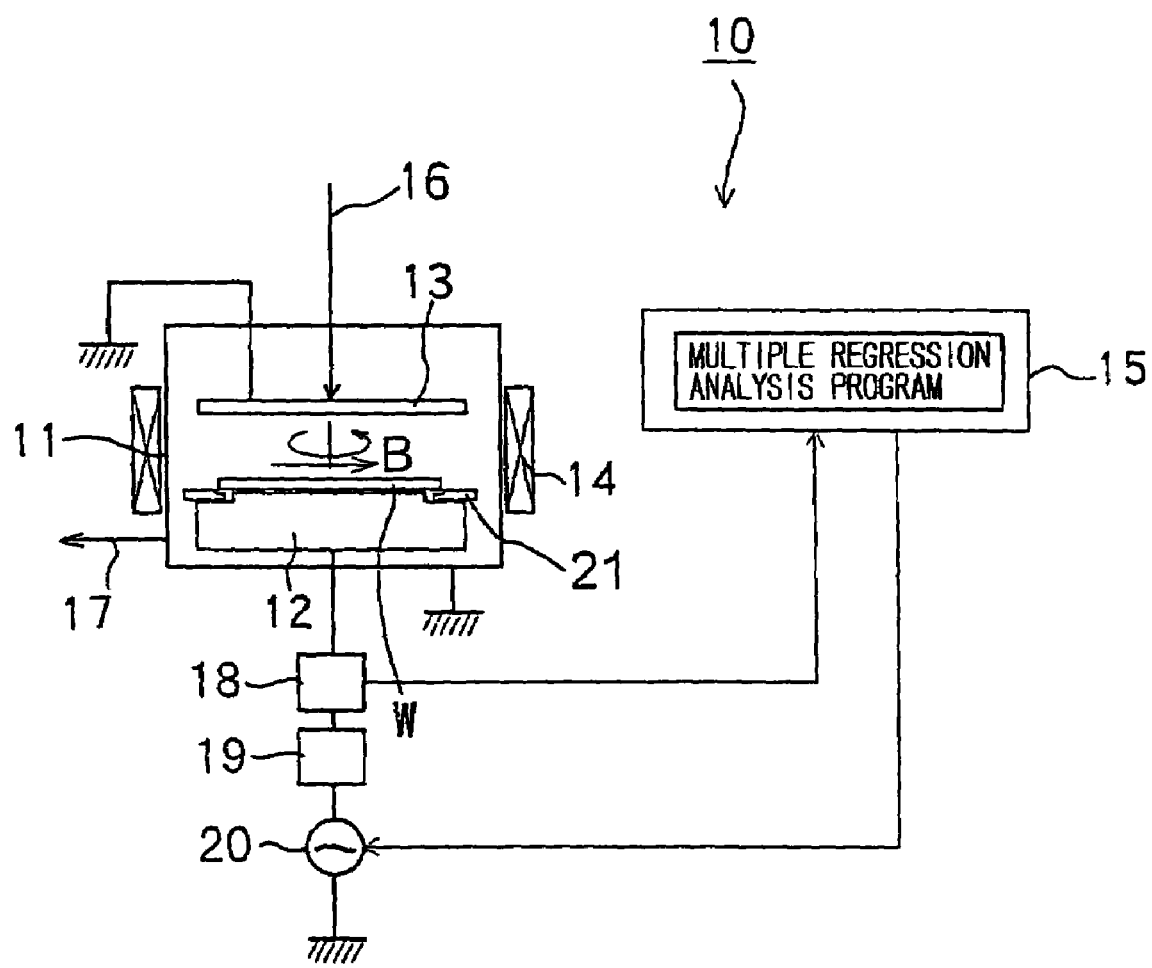
FIG. 1 is a block diagram showing an example of a plasma processing system to which a method for predicting the consumed degree of a consumable supply and a method for predicting the thickness of a deposited film according to the present invention are applied.
Figure 2:
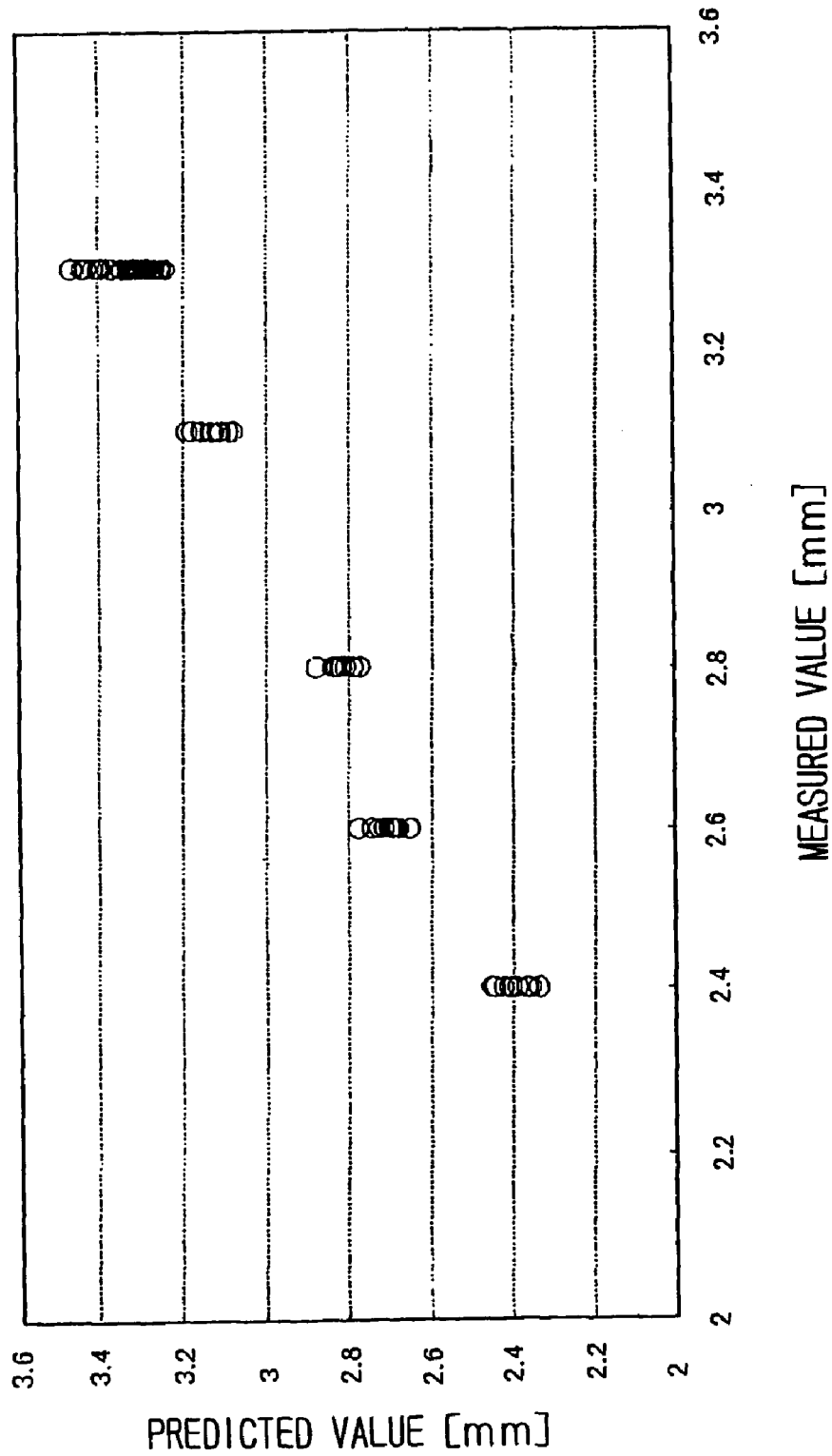
FIG. 2 is a graph showing the relationship between the measured and predicted values of a focus ring, which are obtained by a preferred embodiment of a method for predicting the consumed degree of a consumable supply according to the present invention.
Figure 3:
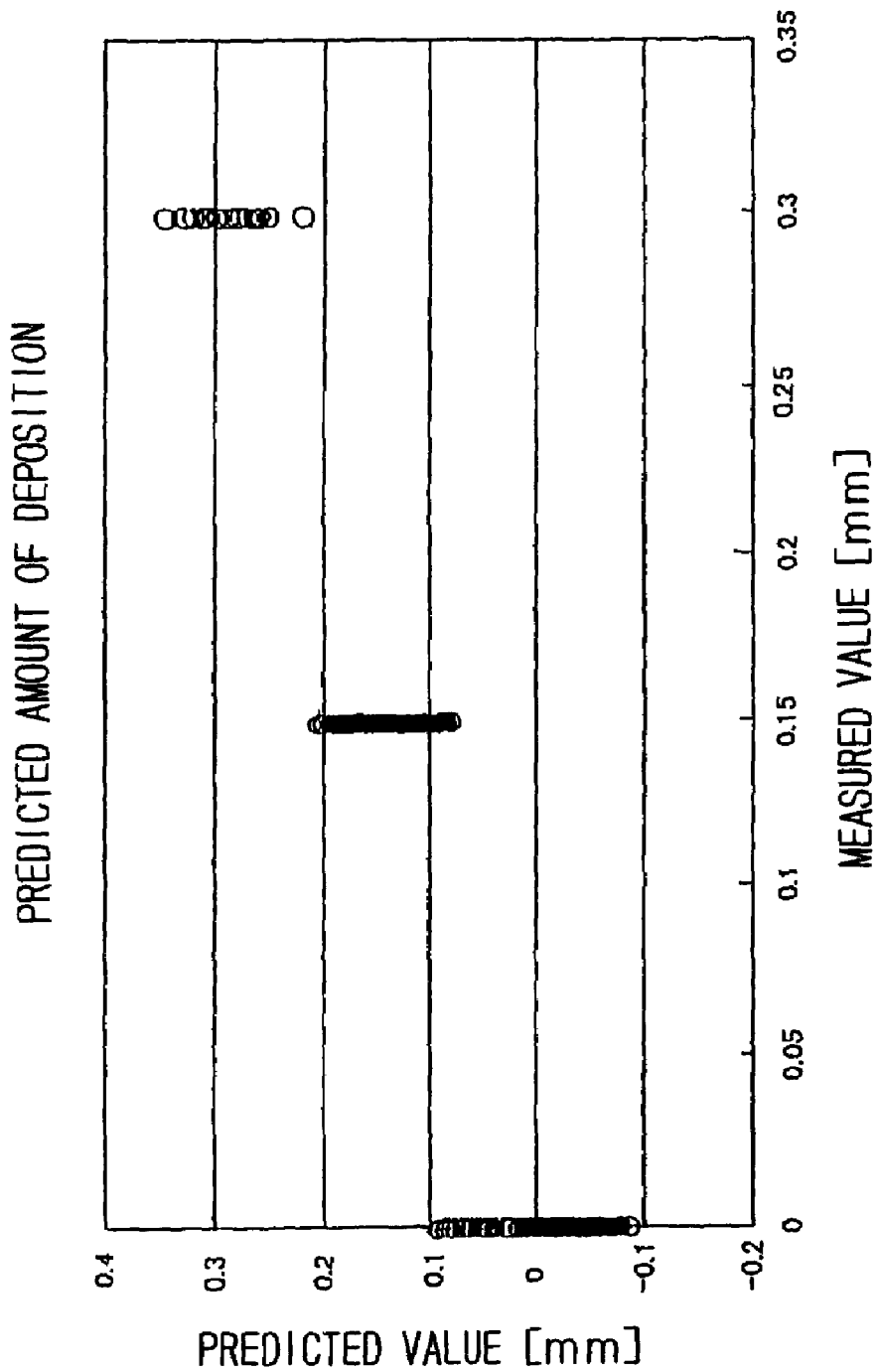
FIG. 3 is a graph showing the relationship between the measured and predicted values of the thickness of a deposited film, which are obtained by a preferred embodiment of a method for predicting the thickness of a deposited film according to the present invention.

Referring now to FIGS. 1 through 3, the preferred embodiments of the present invention will be described below.

First, referring to FIG. 1, an example of a plasma processing system to which a method for predicting the consumed degree of a consumable supply and a method for predicting the thickness of a deposited film according to the present invention are applied will be described below. For example, as shown in FIG. 1, a plasma processing system 10 for use in this preferred embodiment comprises: a processing chamber 11 of a conductive material, such as aluminum; a bottom electrode 12 which is provided on the bottom in the processing chamber 11 and which also serves as a supporting table for supporting thereon a wafer W serving as a processing object; a hollow, grounded top electrode 13 which is provided above the bottom electrode 12 at a predetermined interval and which also serves as a supply part for supplying a process gas; and a magnetic field forming means 14 for applying a rotating magnetic field, wherein a rotating magnetic field B applied by the magnetic field forming means 14 acts upon an electric field generated between the top and bottom electrodes of the processing chamber 11 under the control of a control unit 15 to carry out a uniform plasma processing for the wafer W with high density plasma.

A gas supply pipe 16 communicated with the top electrode 13 is connected to the top face of the processing chamber 11 to supply a process gas into the processing chamber 11 from a gas supply source (not shown) via the gas supply pipe 16 and top electrode 13. A gas exhaust pipe 17 connected to an evacuating system (not shown) is connected to the side face of the processing system 11 to reduce the pressure in the processing chamber 11 via the evacuating system and gas exhaust pipe 17 to hold a predetermined degree of vacuum therein. A high-frequency power supply 20 is connected to the bottom electrode 12 via a voltage/current measuring instrument 18 and a matching circuit 19 to apply a high-frequency power from the high-frequency power supply 20 to the bottom electrode 12 to produce the plasma of the process gas between both electrodes 12 and 13 to carry out a predetermined plasma processing with respect to the surface of the semiconductor wafer W on the bottom electrode 12. A focus ring 21 is provided on the peripheral edge portion of the bottom electrode 12 for converging plasma on the wafer to efficiently carry out the plasma processing.

Although a high-frequency power of 13.56 MHz is applied to the bottom electrode 12 in this preferred embodiment, waves of frequencies integer times (e.g., 27.12 MHz, 40.68 MHz and 54.24 MHz) as many as the high-frequency power of 13.56 MHz serving as a fundamental wave, in addition to the high-frequency power of 13.56 MHz, are formed to be applied. However, it has been revealed that voltage and current between the matching circuit 19 of the supply line for supplying these high-frequency powers and the processing chamber 11 vary in accordance with the variation in environment in the processing chamber 11, e.g., the formation and growth of deposited films and the consumed degree of consumable supplies. Therefore, in this preferred embodiment, the variations in voltage and current are utilized for predicting the consumed degree (e.g., the decrease of thickness) of consumable supplies, e.g., the focus ring 21, and for predicting the thickness of deposited films.

That is, the voltage/current measuring instrument 18 provided between the bottom electrode 12 and the matching circuit 19 is used for intermittently measuring the voltage and current of a plurality of high-frequency waves as electric data, and the measured values are sequentially inputted to the control unit 15, respectively. This control unit 15 stores therein, e.g., a program for multiple regression analysis, as a multivariate analysis program, by which a multiple regression analysis is carried out to carry out the above described predictions. The thickness F of a consumable supply, e.g., the focus ring 21, is associated with the measured values $V(f_n)$ of the voltages of the plurality of high-frequency waves and the measured values $I(f_n)$ of the currents for preparing a multiple regression expression (a linear polynomial expressed by expression (1)) for predicting the thickness of the focus ring 21. In this expression, $f_n$ denotes an n-times wave. Then, $V(f_n)$ and $I(f_n)$ are intermittently measured, and these measured values are used for determining the respective coefficients and constant terms in expression (1) in accordance with a usual method.

$$F = a_0 + a_1 V(f_1) + a_2 V(f_2) + \ldots + a_n V(f_n) + b_1 I(f_1) + b_2 I(f_2) + \ldots + b_n I(f_n) \qquad (1)$$

In this preferred embodiment, focus rings having measured values of 2.4 mm and 3.3 mm were used for carry out a multiple regression analysis. That is, a plurality of wafers were etched on the undermentioned conditions by means of each of processing systems having two kinds of focus rings, the voltages and currents of four kinds of high-frequency powers until a quadruple wave were intermittently measured by means of the voltage/current measuring instrument 18 at intervals of 0.2 seconds to obtain the mean values of each wafer to obtain the measured voltage value $V(f_n)$ and measured current value $I(f_n)$ of each frequency power. Then, these measured values $V(f_n)$ and $I(f_n)$ were substituted for expression (1) to obtain the respective coefficients and constant terms by the multiple regression analysis technique on the basis of the predicted value of a focus ring having a previously revealed thickness. In order to determine the respective coefficients and constant terms, after the mean value of the above described measured values and statistics required to carry out a multiple regression analysis, such as variance and covariance, were obtained, coefficients and constant terms, by which the sum of squares of differences between the measured values and predicted values (calculated values by expression (1)) of the focus ring 21 was minimum, were obtained. After all of the coefficients and constant terms are determined, if the measured voltage and current values $V(f_n)$ and $I(f_n)$ measured during the use of a focus ring having an unknown thickness are substituted for expression (1), the predicted value F for each focus ring 21 is obtained as a concrete numerical value.

[Processing Conditions]
Processing System: Magnetron RIE processing system
Wafer: 200 mm wafer
Film to be etched: Silicon Oxide Film
Underlayer: Silicon Nitride Film
Processing Contents: SAC (self-align., contact)
High Frequency and Power of Power Supply to Bottom Electrode: 13.56 MHZ, 1700 W
Gap between Electrodes: 27 mm
Processing Pressure: 53 mTorr
Process Gases: $C_4F_8$=16 sccm, CO=300 sccm, Ar=400 sccm
Back Side Gas: He=7 Torr (Electrode Central Portion), 40 Torr (Electrode Edge Portion)
DC Voltage of Electrostatic Chuck: 1.5 KV
Processing Temperature: Top Electrode=60° C., Side Wall=60° C., Bottom Electrode=20° C.

FIG. 2 show measured and predicted values with respect to focus rings of 2.6 mm, 2.8 mm and 3.1 mm in addition to focus rings of 2.4 mm and 2.3 mm. The predicted values in these cases are predicted values obtained by substituting the measured values $V(f_n)$ and $I(f_n)$ of each focus ring for the multiple regression expression (1) which has been obtained by the multiple regression analysis of the focus rings of 2.4 mm and 3.3 mm. Also as can be clearly seen from FIG. 2, the measured and predicted values of the focus rings having not been used for the multiple regression analysis change to the upper right similar to data having been used for obtaining the multiple regression analysis, so that it is revealed that expression (1) is sufficiently useful for predicting the thickness of the focus ring.

Moreover, in order to determine whether the multiple regression expression for predicting the thickness F of the focus ring was useful, a variance analysis table for multiple regression analysis was prepared. As a result, it was revealed that the multiple regression expression (1) was useful for predicting the consumed degree of the focus ring 21. After various coefficients for determining the reliability of the multiple regression analysis, such as coefficients of determination and multiple correlation coefficients, were obtained, it was revealed that the prediction of the focus ring using expression (1) was a reliable method.

As described above, according to this preferred embodiment, the measured voltage and current values $V(f_n)$ and $I(f_n)$ of the fundamental wave and its integer-times waves of the high-frequency power supply 20 varying in accordance with the thickness of the focus ring 21 are measured with elapsed time as electric data, and these measured data are used for carrying out the multiple regression analysis to predict the thickness of the focus ring 21. Therefore, it is possible to simply predict the thickness of the focus ring 21 without opening the processing chamber 11 to easily find the consumed degree thereof, so that it is possible to appropriately determine the exchange period of the focus ring 21. By thus finding the life of the focus ring 21, it is not always required to exchange the focus ring 21 during maintenance, so that it is possible to most effectively use the focus ring 21.

Referring to FIG. 3, a method for predicting the thickness of a deposited film in this preferred embodiment will be described below. The measured voltage values $V(f_n)$ and measured current values $I(f_N)$ obtained in the above described preferred embodiment were used for preparing expression (2) as a multiple regression expression for predicting the thickness of a deposited film on the inner wall surface in the processing chamber 11. In expression (2), S denotes a predicted value of the thickness of a deposited film.

$$S = a_0 + a_1 V(f_1) + a_2 V(f_2) + \ldots + a_n V(f_n) + b_1 I(f_1) + b_2 I(f_2) + \ldots + b_n I(f_n) \qquad (2)$$

Specifically, in cases where the measured values of the thickness of deposited films on the inner wall surface of the processing chamber 11 were 0 mm and 0.3 mm, the coefficients and constant terms in expression (2) were obtained from the measured voltage and current values until the quadruple wave (n=4) in the same manner as that in the above described preferred embodiment. Then, expression (2) in which these coefficients and constant terms were determined was used for obtaining a predicted value S of the thickness of the deposited films. FIG. 3 shows the relationship between the measured values and predicted values S in this case.

FIG. 3 shows the measured and predicted values with respect to the deposited film thickness of 0.15 mm, in addition to the deposited film thickness values of 0 mm and 0.3 mm. These predicted values are predicted values obtained by substituting the measured values $V(f_n)$ and $I(f_n)$ in each deposited film thickness for the multiple regression expression (2) obtained by the multiple regression analysis with respect to the deposited film thickness values of 0 mm and 0.3 mm. As can be clearly seen from FIG. 3, the measured and predicted values having not been used for the multiple regression analysis are substantially plotted on a linear straight line similar to data having been used for obtaining the multiple regression analysis, and useful for predicting the thickness of the deposited film.

As described above, according to this preferred embodiment, the measured voltage and current values $V(f_n)$ and $I(f_n)$ of the fundamental wave and its integer-times waves of the high-frequency power supply 20 varying in accordance with the thickness of the deposited film are measured with elapsed time as electric data, and these measured data are used for carrying out the multiple regression analysis to predict the thickness of the deposited film. Therefore, it is possible to simply predict the thickness of the deposited film without opening the processing chamber 11, so that it is possible to appropriately determine a cleaning period in the processing chamber 11.

While the multiple regression analysis has been used for predicting the thickness of the focus ring and the thickness of the deposited film in the plasma processing system for wafers in the above described preferred embodiments, another multivariate analysis technique may be used for predicting the thickness of the focus ring and the thickness of the deposited film. While the thickness of the focus ring and the thickness of the deposited film have been described as examples in the above described preferred embodiments, the present invention can be applied to other consumable supplies (e.g., a top electrode, a shield ring, an outer focus ring) in a processing system.

According to the present invention, it is possible to provide a method for predicting the consumed degree of a consumable supply, which is capable of predicting the exchange period of a consumable supply without opening the processing system, to predict the life of the consumable supply to appropriately determine the exchange period thereof.

According to the present invention, it is also possible to provide a method for predicting the thickness of a deposited film, which is capable of predicting the thickness of a deposited film without opening the processing system, to predict appropriately determine a cleaning period.

The invention claimed is:

1. A method for predicting the consumed degree of a consumable supply for use in a processing system for carrying out a predetermined processing for a processing object with plasma which is produced from a process gas by applying a high-frequency power, said method comprising the steps of:

measuring a plurality of electric data, which vary in accordance with the consumed degree of a consumable supply, with elapsed time; and using the measured electric data to carry out a multivariate analysis to predict said consumed degree;

wherein said consumable supply is a focus ring, and said consumed degree is based on the thickness of said consumable supply, and said step of carrying out the multivariate analysis to predict the consumed degree comprises carrying out a multiple regression analysis to predict the consumed degree;

wherein the voltages and currents of a fundamental wave and waves having frequencies integer times as many as that of the fundamental wave between a matching circuit in a high-frequency power supply line and a processing chamber are used as said electric data;

wherein the said fundamental and waves having frequencies integer times as many as that of the fundamental wave are of four kinds of high-frequency waves including said fundamental wave and its double, triple and quadruple waves.

2. A plasma processing system for carrying out a predetermined processing for a processing object with plasma which is produced from a process gas by applying a high-frequency power, said plasma processing system comprising:

measuring means for measuring a plurality of electric data, which vary in accordance with the consumed degree of a consumable supply, with elapsed time; and predicting means for using said electric data measured by said measuring means, to carry out a multivariate analysis to predict said consumed degree, wherein said consumable supply is a focus ring, and said consumed degree is based on the thickness of said consumable supply, and said predicting means for carrying out the multivariate analysis to predict the consumed degree carries out a multiple regression analysis to predict the consumed degree;

wherein said measuring means is configured to measure the voltages and current of a fundamental wave and waves having frequencies integer times as many as that of the fundamental wave between a matching circuit in a high-frequency power supply line and a processing chamber, as said electric data;

wherein the said fundamental and waves having frequencies integer times as many as that of the fundamental wave are of four kinds of high-frequency waves including said fundamental wave and its double, triple and quadruple waves.

* * * * *

UNITED STATES PATENT AND TRADEMARK OFFICE
CERTIFICATE OF CORRECTION

PATENT NO. : 7,341,644 B2  Page 1 of 1
APPLICATION NO. : 10/312909
DATED : March 11, 2008
INVENTOR(S) : Shinji Sakano et al.

It is certified that error appears in the above-identified patent and that said Letters Patent is hereby corrected as shown below:

On the title page, please insert:

--(30), Foreign Priority Data
July 4, 2000 (JP ) .................................. 2000-201730--

Signed and Sealed this

Twenty-ninth Day of September, 2009

David J. Kappos
*Director of the United States Patent and Trademark Office*